United States Patent
Noda et al.

(10) Patent No.: US 11,069,701 B2
(45) Date of Patent: Jul. 20, 2021

(54) SEMICONDUCTOR MEMORY DEVICE AND MANUFACTURING METHOD THEREFOR

(71) Applicant: TOSHIBA MEMORY CORPORATION, Tokyo (JP)

(72) Inventors: Kosei Noda, Yokkaichi Mie (JP); Takeshi Murata, Yokkaichi Mie (JP); Mitsuhiko Noda, Kuwana Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 75 days.

(21) Appl. No.: 16/114,179

(22) Filed: Aug. 27, 2018

(65) Prior Publication Data
US 2019/0296038 A1    Sep. 26, 2019

(30) Foreign Application Priority Data
Mar. 20, 2018  (JP) .............. JP2018-052439

(51) Int. Cl.
H01L 27/11582    (2017.01)
H01L 27/11573    (2017.01)

(52) U.S. Cl.
CPC .. *H01L 27/11582* (2013.01); *H01L 27/11573* (2013.01)

(58) Field of Classification Search
CPC .................. H01L 27/11582; H01L 27/11573
See application file for complete search history.

(56) References Cited

U.S. PATENT DOCUMENTS 9,431,419 B2    8/2016  Fukuzumi et al.
2015/0372005 A1*  12/2015  Yon .................. H01L 27/11582
                                                              257/5

\* cited by examiner

*Primary Examiner* — Thao X Le
*Assistant Examiner* — Xia L Cross
(74) *Attorney, Agent, or Firm* — Kim & Stewart LLP

(57) ABSTRACT

A semiconductor memory device includes a first conductive layer, second conductive layers extending in a first direction and stacked above the first conductive layer in a second direction, a third conductive layer between the first conductive layer and the second conductive layers, a memory pillar extending inside the second conductive layers in the second direction, a first insulating layer that isolates the second conductive layers in a third direction, and second insulating layers spaced from an end of the first insulating layer and extending in the third direction. The second insulating layers are spaced from an extension line of the first insulating layer that extends in the first direction. The first conductive layer includes a region that overlaps in the second direction a region where extension lines of the first and second insulating layers intersect, and the third conductive layer does not overlap this intersection region in the second direction.

16 Claims, 21 Drawing Sheets

SEMICONDUCTOR MEMORY DEVICE AND MANUFACTURING METHOD THEREFOR

CROSS-REFERENCE TO RELATED APPLICATIONS

This application is based upon and claims the benefit of priority from Japanese Patent Application No. 2018-052439, filed Mar. 20, 2018, the entire contents of which are incorporated herein by reference.

FIELD

Embodiments described herein relate generally to a semiconductor memory device and a manufacturing method therefor.

BACKGROUND

NAND flash memories in which memory cells are arranged three-dimensionally are known as semiconductor memory devices.

DETAILED DESCRIPTION

Figure 1:
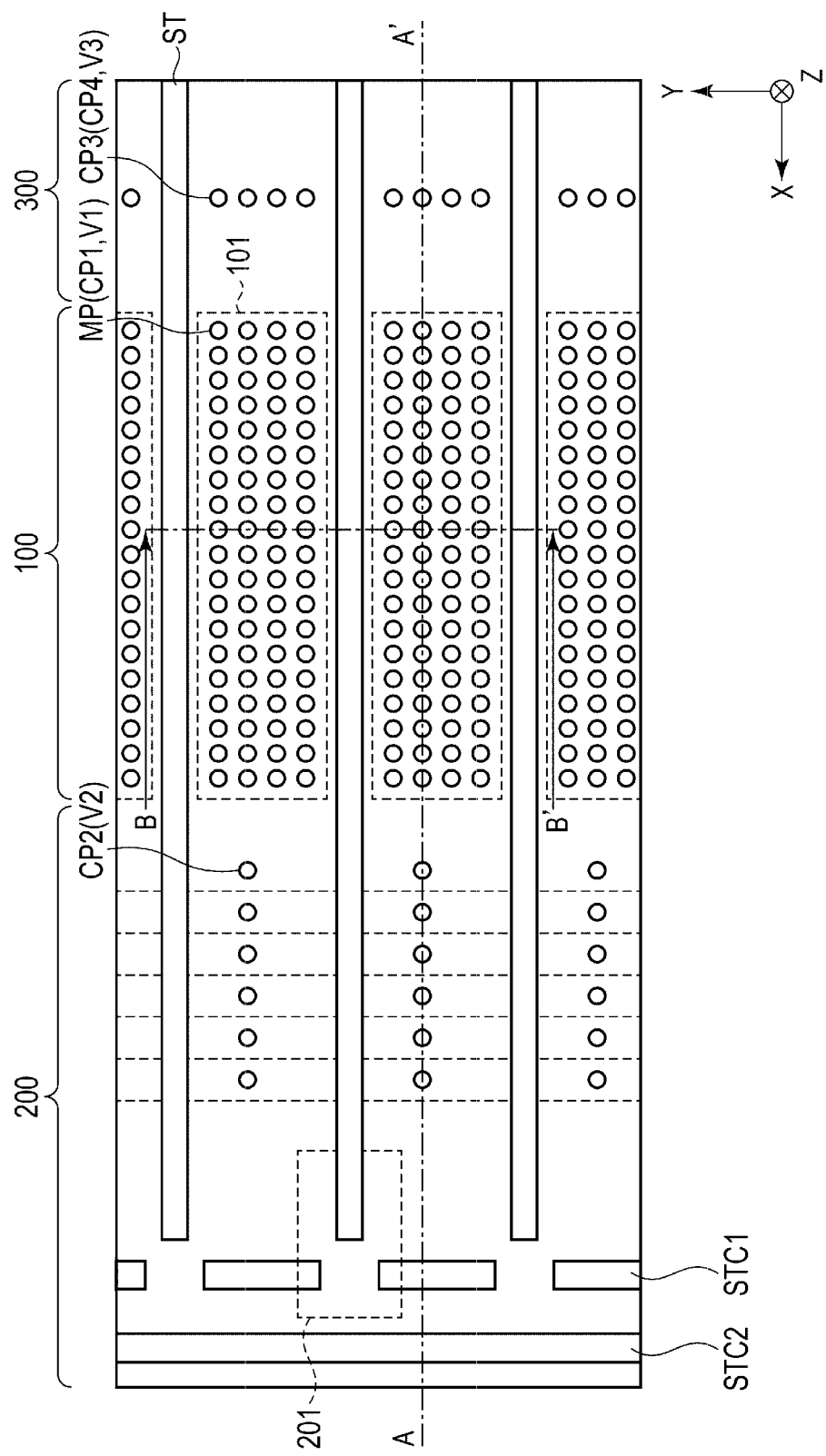
FIG. 1 is a plan view illustrating a configuration of a semiconductor memory device according to a first embodiment.

Embodiments provide a semiconductor memory device capable of reducing a fault occurring in a wiring and a manufacturing method therefor.

In general, according to one embodiment, a semiconductor memory device includes a first conductive layer, a plurality of second conductive layers that extend in a first direction and are stacked above the first conductive layer in a second direction, a third conductive layer between the first conductive layer and the plurality of second conductive layers, a memory pillar that extends inside the plurality of second conductive layers in the second direction, a first insulating layer that extends in the first direction, and isolates the plurality of second conductive layers in a third direction orthogonal to the first direction and the second direction, a plurality of second insulating layers that are spaced from an end of the first insulating layer and extend in the third direction. The plurality of second insulating layers are spaced from an extension line of the first insulating layer that extends in the first direction. The first conductive layer includes a region that overlaps in the second direction an intersection region in which an extension line of the first insulating layer intersects an extension line of the second insulating layer. The third conductive layer does not overlap the intersection region in the second direction.

Hereinafter, embodiments will be described with reference to the drawings. In the following description, the same reference numerals are given to constituent elements that have the same functions and configurations. In each embodiment, a device or a method for embodying technical ideas of the embodiment will be exemplified.

1. First Embodiment

A semiconductor memory device according to a first embodiment will be described. Herein, a three-dimensionally stacked type NAND flash memory in which memory cell transistors (hereinafter referred to as memory cells) are stacked above a semiconductor substrate will be used as a semiconductor memory device.

1.1 Configuration of Semiconductor Memory Device

Figure 2:
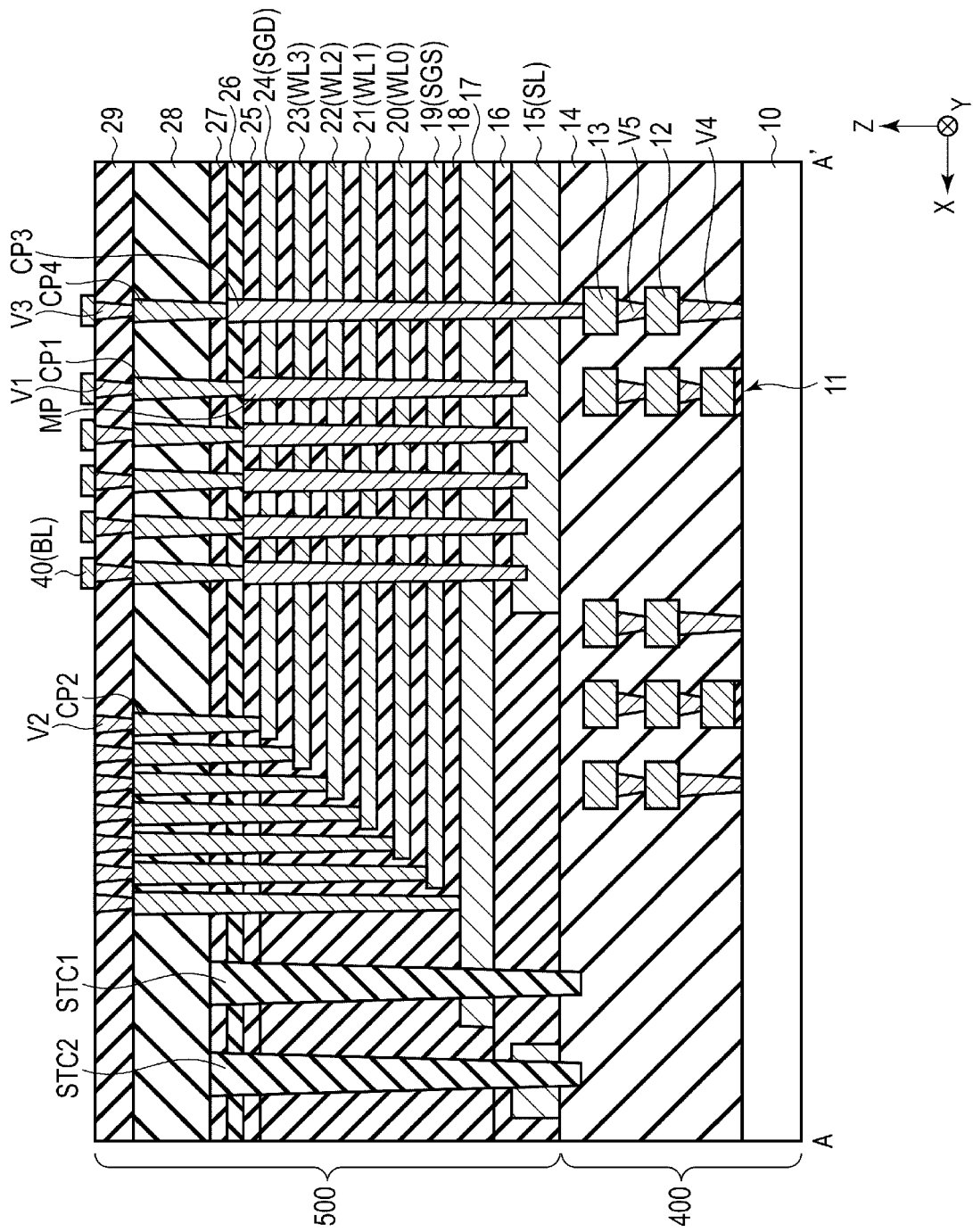
FIG. 2 is a sectional view taken along the line A-A' of FIG. 1.
Figure 3:
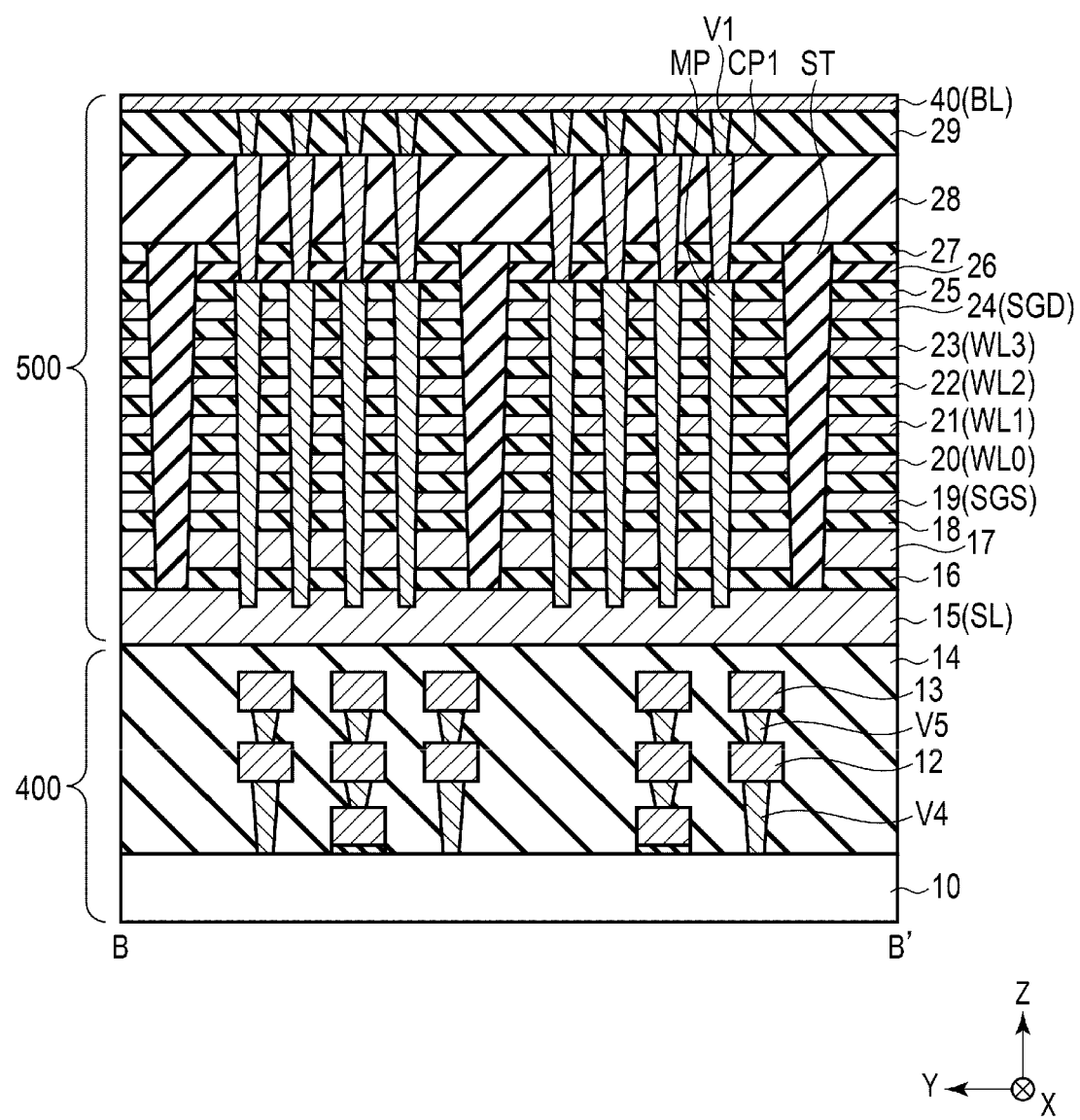
FIG. 3 is a sectional view taken along the line B-B' of FIG. 1.

FIG. 1 is a plan view illustrating a configuration of a semiconductor memory device according to a first embodiment. FIG. 2 is a sectional view taken along the line A-A' of FIG. 1. FIG. 3 is a sectional view taken along the line B-B' of FIG. 1. In FIG. 1, two directions orthogonal to each other and parallel to a semiconductor substrate surface are referred to as X and Y directions and a direction orthogonal to the X and Y directions (XY plane) is referred to as a Z direction. In FIG. 1, bit lines are omitted.

As illustrated in FIG. 1, the semiconductor memory device includes a memory cell array region 100, a drawing region 200, and a contact region 300.

The memory cell array region 100 includes a plurality of memory blocks 101. Each of the plurality of memory blocks 101 extends in the X direction and is arranged in the Y direction. Each of the plurality of memory blocks 101 has the same configuration.

The memory block 101 includes a plurality of memory pillars MP. The plurality of memory pillars MP are arranged in a matrix form, that is, in the X and Y directions. Any number of memory pillars MP can be used. As illustrated in FIGS. 2 and 3, the memory pillars MP are connected to conductive layers 40 through contacts CP1 and vias V1. The conductive layer 40 functions as a bit line BL.

Slits (isolating layers) ST extending in the X direction are provided between the plurality of memory blocks 101. The memory blocks 101 are isolated by the slits ST. Any number of slits ST can be used.

The drawing region 200 includes a plurality of contacts CP2 connected to word lines to be described below. The contacts CP2 are arranged in the X direction. The contacts CP2 are connected to the vias V2, as illustrated in FIG. 2.

Slits (isolating layers) STC1 and STC2 extending in the Y direction orthogonal to the X direction in which the slits ST extend on a chip end side of the drawing region 200 (or an opposite side to the memory cell array region 100). Source-side select gate lines in each memory block 101 are isolated by the slit STC1. The slit STC1 is provided to be spaced on an extension line of the slit ST so that the slit STC1 does not intersect the slit ST. That is, the slit STC1 is not provided on the extension line of the slit ST and is provided intermittently to be spaced on the extension line of the slit ST. The slit STC2 is spaced from the slit STC1 and is disposed to be parallel to the slit STC1. The slits STC2 function to alleviate stress of inter-layer insulating layers (for example, silicon oxide layers) provided in the drawing region 200, the memory cell array region 100, and the contact region 300.

The contact region 300 includes a plurality of through contacts CP3 connected to a peripheral circuit to be described below. The through contacts CP3 are connected to vias V3 through contacts CP4, as illustrated in FIG. 2.

As illustrated in FIGS. 2 and 3, a peripheral circuit region 400 and a memory circuit region 500 are provided on a semiconductor substrate, for example, the silicon substrate 10. The peripheral circuit region 400 includes a peripheral circuit that controls writing, reading, and erasing of data on and from the memory cells. The peripheral circuit includes a CMOS circuit 11 that includes an n-channel MOS transistor (hereinafter referred to as an nMOS transistor) and a p-channel MOS transistor (hereinafter referred to as a pMOS transistor). In the memory circuit region 500, the plurality of memory pillars MP described above, a plurality of word lines WL0 to WL3, a source line SL, and the bit lines BL are provided. Hereinafter, when the word lines WL are described, the word lines WL are assumed to be word lines WL0 to WL3. Herein, when the number of word lines is 4, any number of word lines can be used.

Here, for example, the configuration in which the memory circuit region 500 is provided on the peripheral circuit region 400 has been described, but an embodiment is not limited thereto. The peripheral circuit region 400 may be provided on the memory circuit region 500, or the peripheral circuit region 400 and the memory circuit region 500 may be lined horizontally.

Hereinafter, a cross-sectional structure taken along the line A-A' in the semiconductor memory device will be described with reference to FIG. 2. For example, the via V4 and the CMOS circuit 11 including the nMOS transistor and the pMOS transistor are provided on the silicon substrate 10. The via V4 is connected to sources, drains, or gates of the nMOS transistor and the pMOS transistor.

A conductive layer (for example, a wiring or a pad) 12 is provided on the via V4. A via V5 is provided on the conductive layer 12. A conductive layer (for example, a wiring or a pad) 13 is provided on the via V5. An insulating layer 14 is provided in the periphery of the CMOS circuit 11, the conductive layers 12 and 13, and the vias V4 and V5 on the silicon substrate 10.

A conductive layer 15 is provided on the insulating layer 14. The conductive layer 15 functions as the source line SL. An insulating layer 16 is provided on the conductive layer 15. A conductive layer 17 is provided on the insulating layer 16.

A plurality of insulating layers 18 and a plurality of conductive layers 19 to 24 are alternately stacked on the conductive layer 17. The conductive layers 17 and 19 to 24 extend in the X direction. The conductive layers 17 and 19 function as source-side select gate lines SGS. The conductive layers 20 to 23 function as the plurality of word lines WL0 to WL3, respectively. The conductive layer 24 functions as a drain-side select gate line SGD.

An insulating layer 25 is provided on the conductive layer 24. The memory pillar MP with a pillar shape extending in the Z direction is provided in the plurality of insulating layers 16 and 18, the plurality of conductive layers 17 and 19 to 24, and the insulating layer 25. One end of the memory pillar MP is connected to the conductive layer 15 (the source line SL) and the other end of the memory pillar MP reaches the upper surface of the insulating layer 25. That is, the memory pillars MP reach the source line SL from the upper surface of the insulating layer 25 through the insulating layer 25, the drain-side select gate line SGD, the plurality of insulating layers 18, the plurality of word lines WL0 to WL3, the source-side select gate line SGS, and the insulating layer 16. The details of the memory pillar MP will be described later.

Insulating layers 26, 27, and 28 are provided on the memory pillars MP and the insulating layer 25. In the memory cell array region 100, the contact CP1 extending in the Z direction is provided in the insulating layers 26 to 28. The contact CP1 reaches the memory pillar MP from the upper surface of the insulating layer 28. The contact CP1 is connected to the memory pillar MP.

In the drawing region 200, a plurality of contacts CP2 extending in the Z direction are provided in the insulating layers 18 and 25 to 28. The contacts CP2 reach the conductive layers 19 to 24 from the upper surface of the insulating layer 28. The contacts CP2 are connected to the conductive layer 17, the source-side select gate line SGS, the word lines WL0 to WL3, and the drain-side select gate line SGD, respectively.

In the contact region 300, a through contact CP3 extending in the Z direction is provided in the insulating layers 14, 16, 18, 25, and 26 and the conductive layers 15, 17, and 19 to 24. The through contact CP3 reaches the conductive layer 13 from the upper surface of the insulating layer 26. The through contact CP3 is connected to the conductive layer 13. A contact CP4 extending in the Z direction is provided in the insulating layers 27 and 28. The contact CP4 reaches the through contact CP3 from the upper surface of the insulating layer 28. The contact CP4 is connected to the through contact CP3.

Further, an insulating layer 29 is provided on the contacts CP1, CP2, and CP4 and the insulating layer 28. In the memory cell array region 100, the via V1 extending in the Z direction is provided in the insulating layer 29. The via V1 reaches the contact CP1 from the upper surface of the insulating layer 29. The via V1 is connected to the contact CP1. The conductive layer 40 (the bit line BL) is provided on the via V1. The conductive layer 40 is connected to the via V1.

In the drawing region 200, the vias V2 extending in the Z direction are provided in the insulating layer 29. The via V2 reaches the contact CP2 from the upper surface of the insulating layer 29. The via V2 is connected to the contact CP2.

In the contact region 300, the via V3 extending in the Z direction is provided in the insulating layer 29. The via V3 reaches to the contact CP4 from the upper surface of the insulating layer 29. The via V3 is connected to the contact CP4.

Next, a cross-sectional structure of the semiconductor memory device taken along the line B-B' will be described with reference to FIG. 3. The structure of the peripheral circuit region 400 and the memory block 101 including the memory pillars MP is the same as the structure illustrated in FIG. 2. Here, another structure will be described.

As described above, the slit ST extending in the X direction is provided between the memory blocks 101. The slit ST isolates the memory blocks 101. In other words, the slit ST isolates the conductive layers 17 and 19 to 24 and the memory cell array including the memory pillars MP.

1.1.1 Details of Memory Pillar MP

Figure 4:
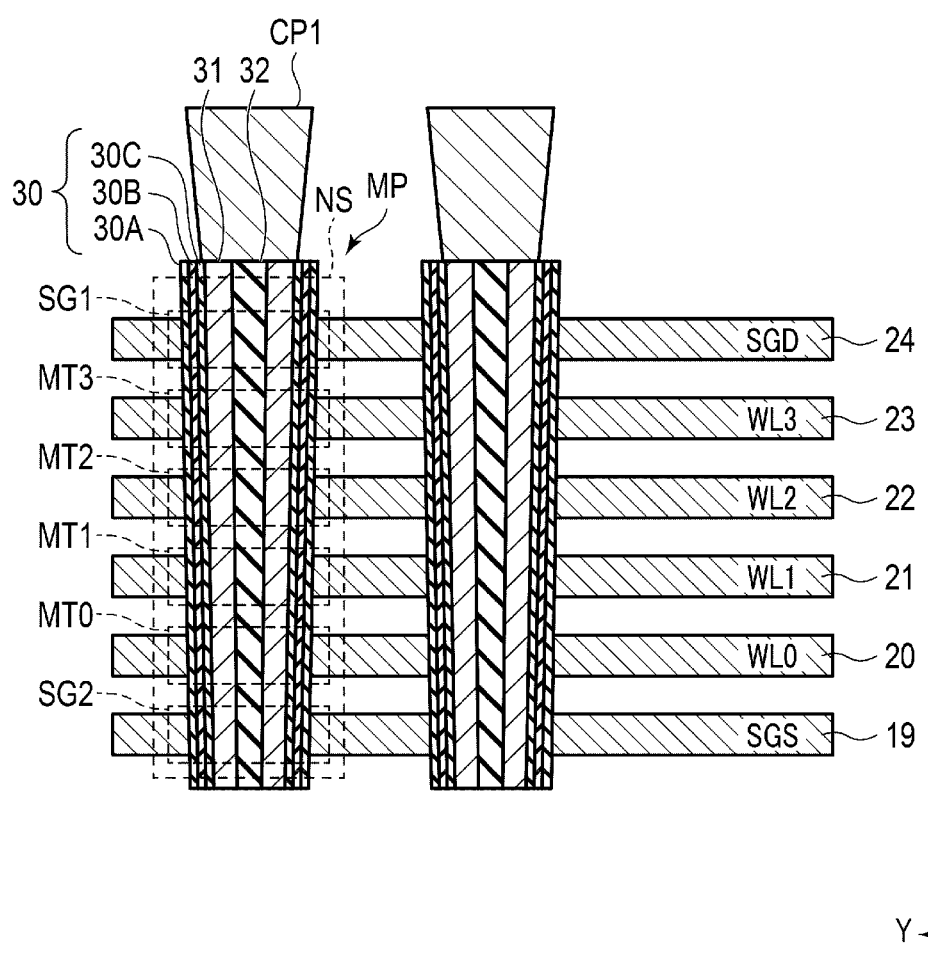
FIG. 4 is a sectional view taken in the Y direction of a memory pillar according to a first embodiment.

Next, the detailed configuration of the memory pillar MP in the semiconductor memory device according to the first embodiment will be described with reference to FIG. 4. FIG. 4 is a sectional view taken in the Y direction of the memory pillar. Herein, the insulating layers are not illustrated.

The memory pillar MP functions as a NAND string NS. The NAND string NS includes a select transistor SG1, memory cell transistors MT0 to MT3, and a select transistor SG2.

As illustrated in FIG. 4, the conductive layer 19 (the source-side select gate line SGS), the conductive layers 20 to 23 (the word lines WL0 to WL3), and the conductive layer 24 (the drain-side select gate line SGD) are arranged in the Z direction. The memory pillar MP is provided to penetrate through the conductive layers 19 to 24. The NAND string NS is formed at intersections between the conductive layers 19 to 24 and the memory pillars MP.

The memory pillar MP includes, for example, a cell insulating layer 30, a semiconductor layer 31, and a core insulating layer 32. The cell insulating layer 30 includes a block insulating layer 30A, a charge storage layer 30B, and a tunnel insulating layer (or a gate insulating layer) 30C.

Specifically, the block insulating layer 30A is provided on an inner wall of a memory hole which is used to form the memory pillar MP. The charge storage layer 30B is provided on the inner wall of the block insulating layer 30A. The tunnel insulating layer 30C is provided on the inner wall of the charge storage layer 30B. The semiconductor layer 31 is provided on the inner wall of the tunnel insulating layer 30C. Further, the core insulating layer 32 is provided inside the semiconductor layer 31. The core insulating layer 32 includes, for example, a silicon oxide layer.

In the configuration of the memory pillar MP, a portion in which the memory pillar MP and the conductive layer 19 (and the conductive layer 17) intersect each other functions as the select transistor SG2. Portions in which the memory pillar MP and the conductive layers 20 to 23 intersect each other function as the memory cell transistors MT0 to MT3, respectively. A portion in which the memory pillar MP and the conductive layer 24 intersect each other functions as the select transistor SG1. Hereinafter, when the memory cell transistors MT are described, the memory cell transistors MT are assumed to be memory cell transistors MT0 to MT7.

The semiconductor layer 31 functions as a channel layer of the memory cell transistors MT and the select transistors SG1 and SG2. The semiconductor layer 31 is a layer that contains, for example, silicon.

The charge storage layer 30B functions as a charge storage layer that stores charges injected from the semiconductor layer 31 in the memory cell transistors MT. The charge storage layer 30B includes, for example, a silicon nitride layer.

The tunnel insulating layer 30C functions as a potential barrier when charges are injected from the semiconductor layer 31 to the charge storage layer 30B or when charges stored in the charge storage layer 30B diffuse to the semiconductor layer 31. The tunnel insulating layer 30C includes, for example, a silicon oxide layer.

The block insulating layer 30A prevents the charges stored in the charge storage layer 30B from diffusing to the conductive layers (the word lines WL) 20 to 23. The block insulating layer 30A includes, for example, a silicon oxide layer and a silicon nitride layer.

1.1.2 Configuration of Slits ST and Slit STC1 and Manufacturing Method therefor

Next, a method of manufacturing the slit in the semiconductor memory device according to the first embodiment will be described with reference to FIGS. 5 to 22. The slits ST, STC1, and STC2 are manufactured in the same process. Hereinafter, processes of slits ST and STC1 are illustrated. A process for the slits ST, STC1, and STC2 may be formed in different processes.

Figure 5:
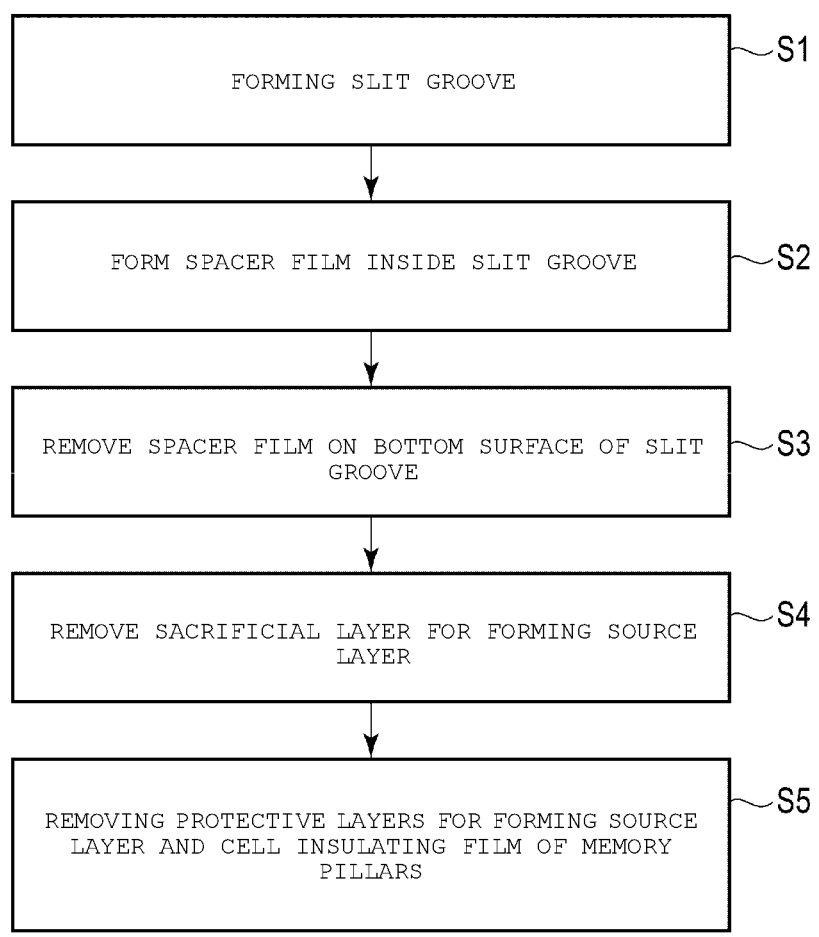
FIG. 5 is a flowchart illustrating a method of manufacturing slits in the semiconductor memory device according to the first embodiment.

FIG. 5 is a flowchart illustrating a method of manufacturing the slits in the semiconductor memory device according to the first embodiment. First, a groove for the slits ST and STC1 is formed (step S1). Subsequently, a spacer layer is formed on the inner wall of the slit groove (step S2). Subsequently, the spacer layer on the bottom surface of the slit groove is removed (step S3). Subsequently, a sacrificial layer for forming a source layer is removed (step S4). Subsequently, a protective layer for forming the source layer and a cell insulating layer of the memory pillar MP is removed (step S5).

Figure 6:
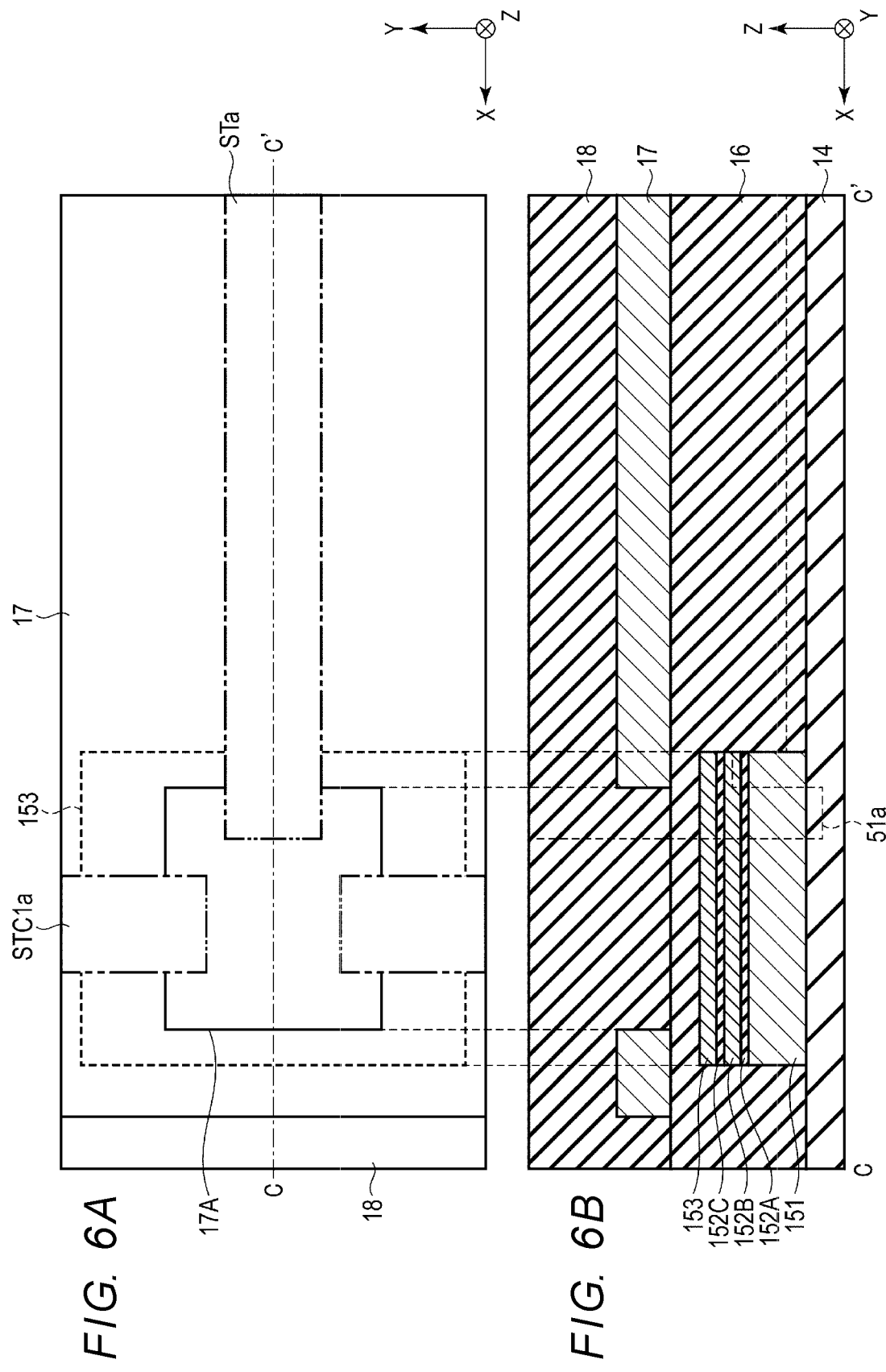
FIGS. 6A and 6B are diagrams illustrating a method of manufacturing a first region including an intersection region of the slits according to the first embodiment.

Next, a method is described of manufacturing a region (hereinafter referred to as a first region) 201 including an intersection region in which an extension line of the slit ST and an extension line of the slit STC1 intersect each other in the semiconductor memory device according to the first embodiment, as illustrated in FIG. 1, according to the flow of the manufacturing method illustrated in FIG. 5. FIGS. 6A to 22 are diagrams illustrating the manufacturing method in the first region including the intersection region between the extension lines of the slits ST and STC1. FIG. 6A is a plan view illustrating an expanded region equivalent to the first region 201 in FIG. 1 and FIG. 6B is a sectional view taken along the line C-C' of FIG. 6A. STa and STC1a illustrated in FIG. 6A indicate mask patterns of the slits ST and STC1 formed in subsequent processes and indicate the patterns and positions of the slits ST and STC1. A dotted line 51a illustrated in FIG. 6B indicates a shape of a groove assumed when a groove for the slits ST and STC1 is formed.

Figure 8:
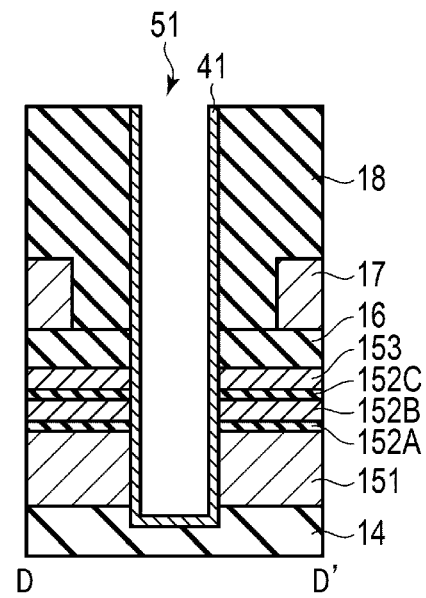
FIG. 8 is a diagram illustrating the method of manufacturing the first region of the slits according to the first embodiment.
Figure 9:
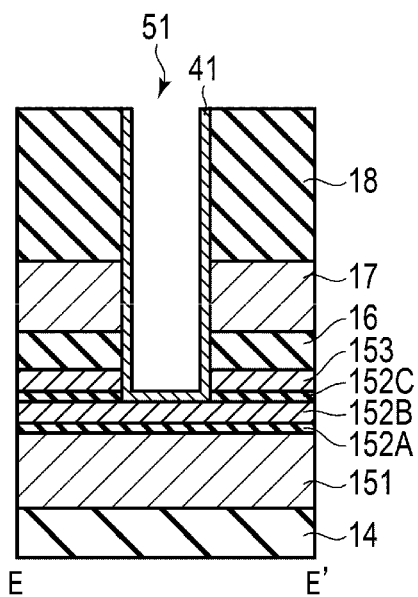
FIG. 9 is a diagram illustrating the method of manufacturing the first region of the slits according to the first embodiment.
Figure 10:
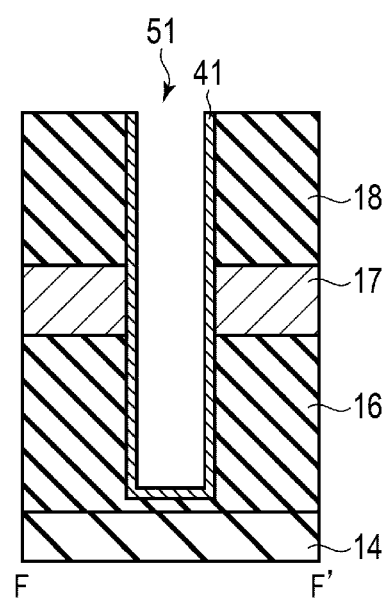
FIG. 10 is a diagram illustrating the method of manufacturing the first region of the slits according to the first embodiment.

FIGS. 7, 11, 15, and 19 are sectional views equivalent to a region along the line C-C' of FIG. 6A. FIGS. 8 to 10 are sectional views taken along the lines D-D', E-E', and F-F' in FIG. 7. FIGS. 12 to 14 are sectional views taken along the lines D-D', E-E', and F-F' in FIG. 11. FIGS. 16 to 18 are sectional views taken along the lines D-D', E-E', and F-F' in FIG. 15. Further, FIGS. 20 to 22 are sectional views taken along the lines D-D', E-E', and F-F' in FIG. 19.

A manufacturing method and a structure before the slit groove is formed will first be described.

For example, a peripheral circuit (not illustrated) including wirings or the like and the CMOS circuit 11 are formed on the silicon substrate 10. Further, the insulating layer 14 is formed to cover the silicon substrate 10 and the peripheral circuit. The insulating layer 14 includes, for example, a silicon oxide layer.

Subsequently, a layer containing metal such as a tungsten silicide layer is formed on the insulating layer 14. Thereafter, the layer containing metal formed in the first region that includes the intersection region between the extension line of the slit ST and the extension line of the slit STC1 formed in processes to be described below is removed.

Subsequently, a conductive layer 151, a protective layer 152A, a sacrificial layer 152B, a protective layer 152C, and a conductive layer 153 are formed in this order on the insulating layer 14. Thereafter, an island-shaped stacked body, that is, the conductive layer 151, the protective layer 152A, the sacrificial layer 152B, the protective layer 152C, and the conductive layer 153, is formed in the first region in accordance with a lithographic method, as illustrated in FIG. 6B. The conductive layer 151 includes, for example, a multicrystal silicon layer to which phosphorus is added. The protective layers 152A and 152C include, for example, a silicon oxide layer. The sacrificial layers 152B and 153 include, for example, a multicrystal silicon layer to which no impurity is added.

Subsequently, the insulating layer 16 is formed on the conductive layer 153. The conductive layer 17 is formed on the insulating layer 16. Subsequently, the conductive layer 17 including an opening 17A is formed in the first region in accordance with a lithographic method. Thereafter, a plurality of insulating layers (for example, silicon oxide layer) 18 and a plurality of insulating layers (for example, silicon nitride layers) are alternately stacked on the conductive layer 17. Further, a necessary insulating layer is formed on the uppermost silicon nitride layer. The insulating layer 16 includes, for example, a silicon oxide layer. The conductive layer 17 includes, for example, a multicrystal silicon layer.

Subsequently, for example, a groove 51 for the slits ST and STC1 is formed in accordance with a reactive ion etching (RIE), as illustrated in FIGS. 7 to 10 (step S1). Subsequently, the spacer layer 41 is formed inside the slit groove 51 in accordance with, for example, a chemical vapor deposition (CVD) method (step S2). The spacer layer 41 includes, for example, a silicon nitride layer.

Figure 7:
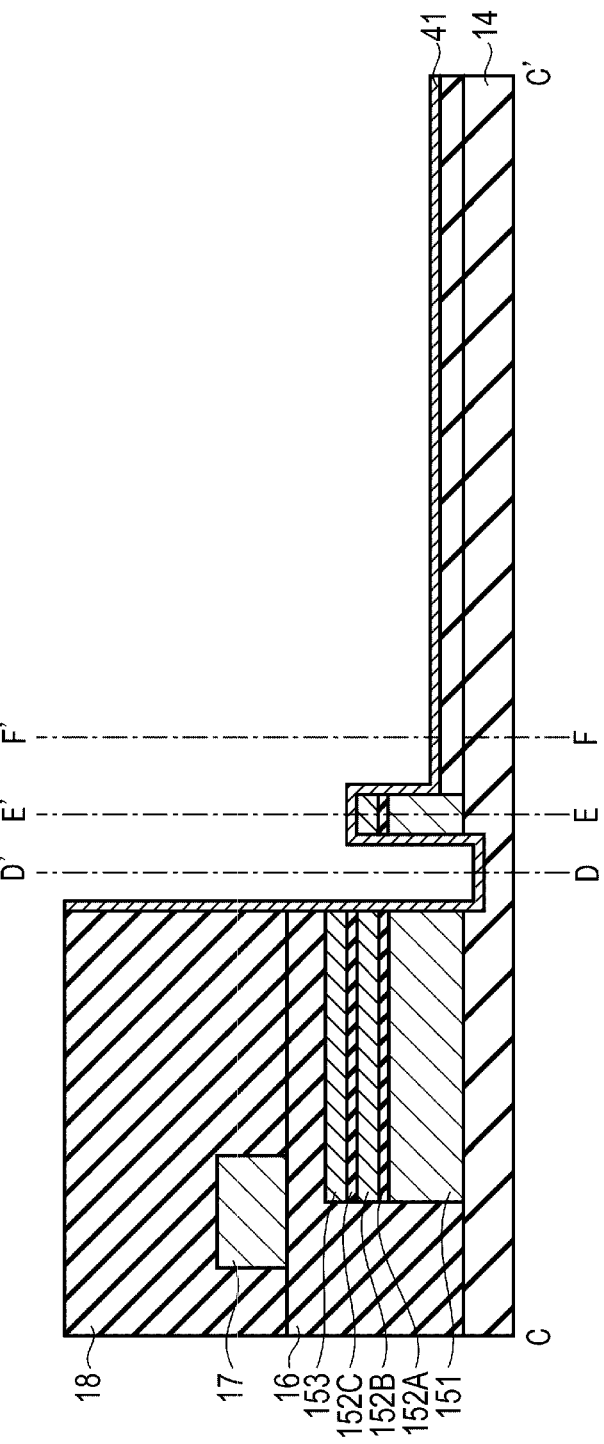
FIG. 7 is a diagram illustrating the method of manufacturing the first region of the slits according to the first embodiment.

The cross-sectional structure along the C-C' after the spacer layer 41 is formed is illustrated in FIG. 7. The cross-sectional structures along the lines D-D', E-E', and F-F' in FIG. 7 are illustrated in FIGS. 8, 9, and 10, respectively. The cross section along the line D-D' illustrated in FIG. 8 is a region in which the conductive layer 17 is not provided and an island-shaped stacked body is provided before the slit groove is formed. The cross section along the line E-E' illustrated in FIG. 9 is a region in which the conductive layer 17 and the island-shaped stacked body are both provided before the slit groove is formed. The cross section along the line F-F' illustrated in FIG. 10 is a region in which the conductive layer 17 is provided and an island-shaped stacked body is not provided and is distant from the first region before the slit groove is formed.

As illustrated in FIG. 8, on the cross section along the line D-D', the depth of the slit groove 51 reaches a halfway portion of the insulating layer 14 below the lower surface of the conductive layer 151. However, the depth of the slit groove 51 does not reach a wiring or the like provided in the peripheral circuit on the silicon substrate 10. As illustrated in FIG. 9, on the cross section along the line E-E', the depth of the slit groove 51 reaches up to the sacrificial layer 152B. As illustrated in FIG. 10, on the cross section along the line F-F', the depth of the slit groove 51 reaches up to the insulating layer 16 located in a halfway portion in the thickness of the conductive layer 151.

Figure 11:
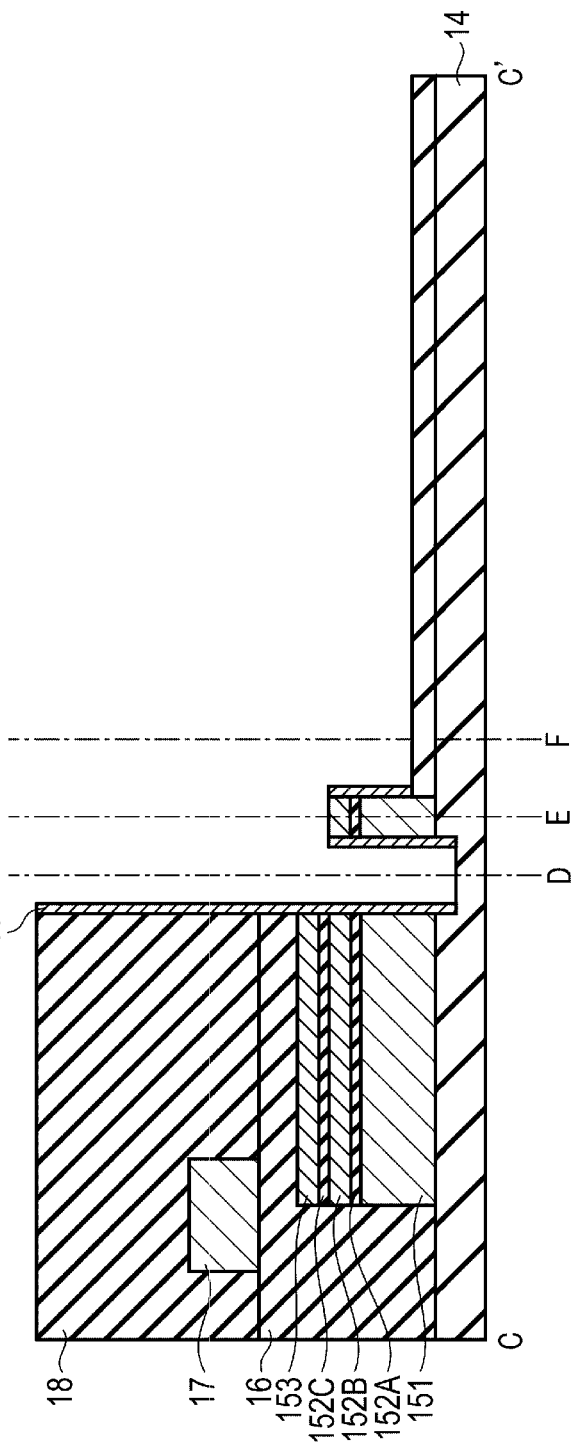
FIG. 11 is a diagram illustrating the method of manufacturing the first region of the slits according to the first embodiment.
Figure 12:
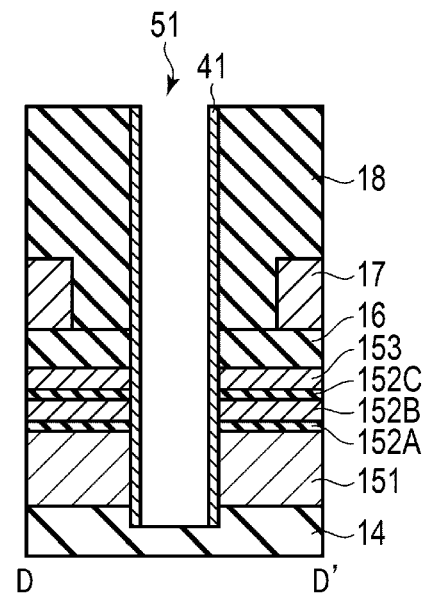
FIG. 12 is a diagram illustrating the method of manufacturing the first region of the slits according to the first embodiment.
Figure 13:
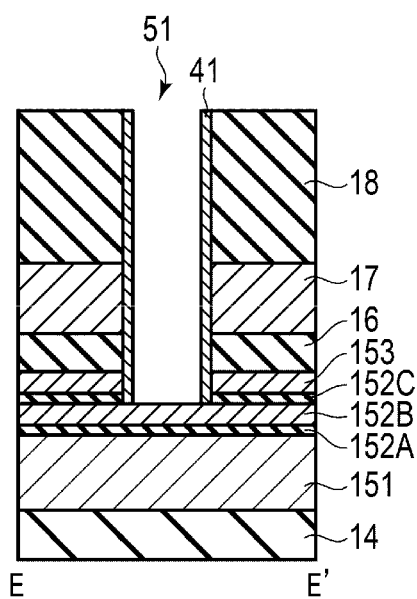
FIG. 13 is a diagram illustrating the method of manufacturing the first region of the slits according to the first embodiment.
Figure 14:
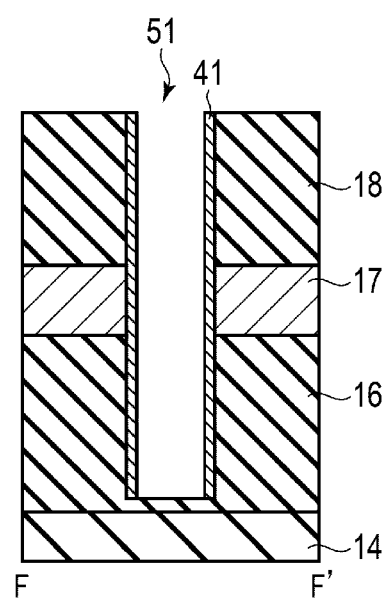
FIG. 14 is a diagram illustrating the method of manufacturing the first region of the slits according to the first embodiment.

Subsequently, as illustrated in FIGS. 11 to 14, the spacer layer 41 on the bottom surface of the slit groove 51 is removed in accordance with, for example, an RIE method (step S3). Thus, the cross-sectional structure along the C-C' is illustrated in FIG. 11. The cross-sectional structures along the lines D-D', E-E', and F-F' in FIG. 11 are illustrated in FIGS. 12, 13, and 14, respectively. As illustrated in FIG. 12, on the cross section along the D-D', the spacer layer 41 on the bottom surface of the slit groove 51 is removed. As illustrated in FIGS. 13 and 14, on the cross sections along the lines E-E' and F-F', the spacer layer 41 on the bottom surface of the slit groove 51 is removed.

Figure 15:
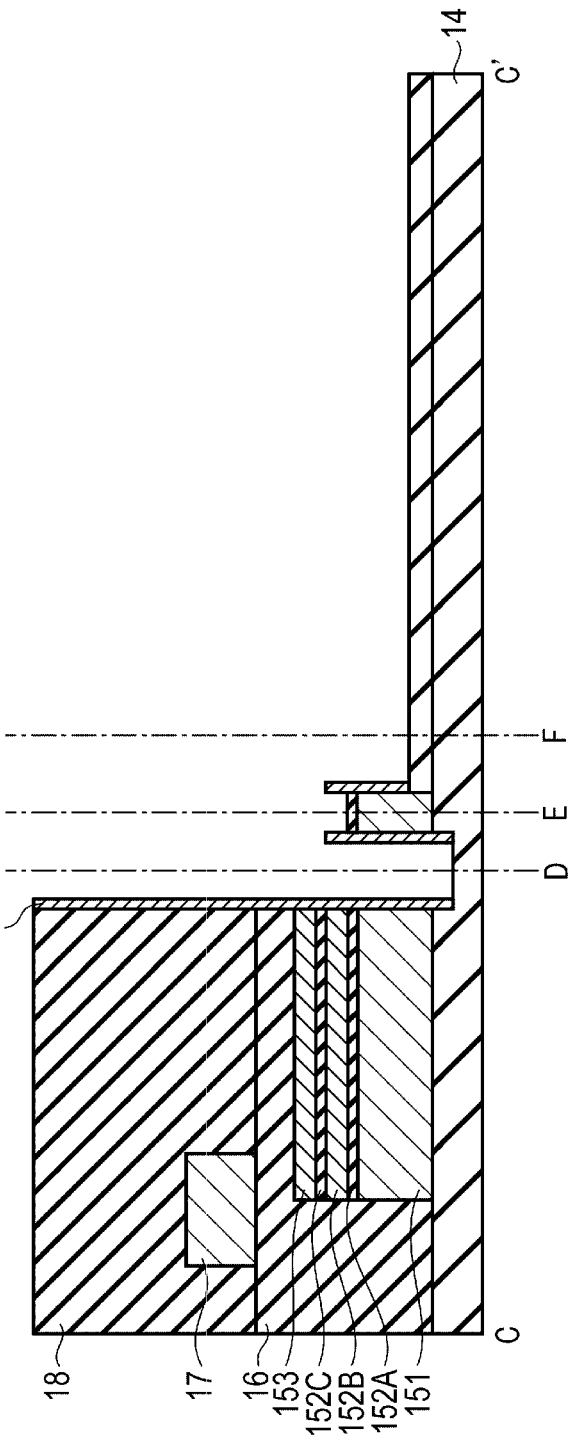
FIG. 15 is a diagram illustrating the method of manufacturing the first region of the slits according to the first embodiment.
Figure 16:
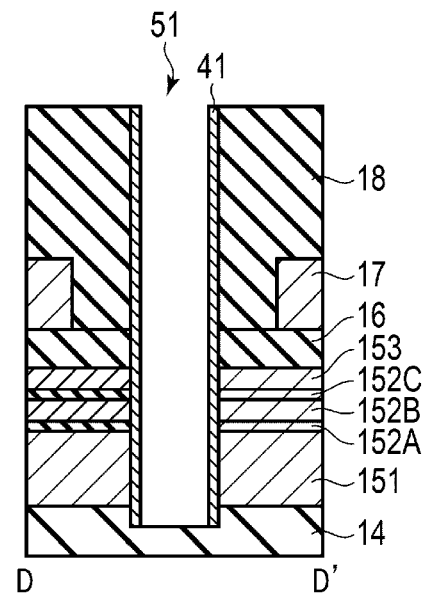
FIG. 16 is a diagram illustrating the method of manufacturing the first region of the slits according to the first embodiment.
Figure 17:
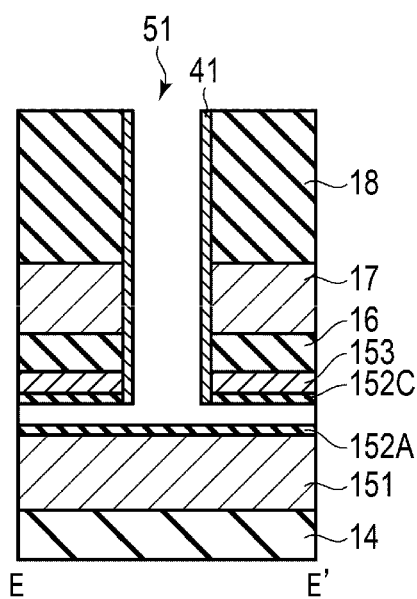
FIG. 17 is a diagram illustrating the method of manufacturing the first region of the slits according to the first embodiment.
Figure 18:
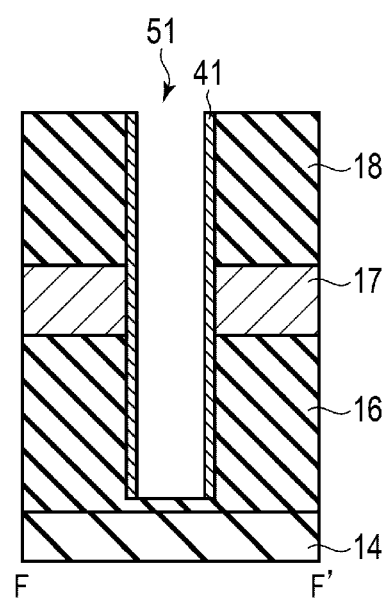
FIG. 18 is a diagram illustrating the method of manufacturing the first region of the slits according to the first embodiment.

Subsequently, for example, as illustrated in FIGS. 15 to 18, hot TMY (trimethyl-2-hydroxyethyltrimethylammonium hydroxide) is supplied through the slit groove 51 to remove the sacrificial layer 152B in a region in which the source layer is formed. The sacrificial layer 152B illustrated in FIG. 15, which corresponds to the opening 17A, is not removed since the sacrificial layer 152B is not the region in which the source layer is formed (step S4). Thus, the cross-sectional structure along the C-C' is illustrated in FIG. 15. The cross-sectional structures along the lines D-D', E-E', and F-F' in FIG. 15 are illustrated in FIGS. 16, 17, and 18.

As illustrated in FIG. 16, since the spacer layer (for example, a silicon nitride layer) 41 is on the side wall of the slit groove 51 and the insulating layer (for example, the silicon oxide layer) 14 is on the bottom surface of the slit groove 51 on the cross section along the line D-D', etching is not performed on the side wall and the bottom surface of the slit groove 51. As illustrated in FIG. 17, since the spacer layer 41 is on the side wall of the slit groove 51 and the sacrificial layer (for example, a multicrystal silicon layer) 152B is on the bottom surface of the slit groove 51 on the cross section along the line E-E', the sacrificial layer 152B is etched. As illustrated in FIG. 18, since the spacer layer 41 is on the side wall of the slit groove 51 and the insulating layer (for example, a silicon oxide layer) 16 is on the bottom surface of the slit groove 51 on the cross section along the line F-F', etching is not performed on the side wall and the bottom surface of the slit groove 51. As described above, the spacer layer 41 prevents the conductive layers 17, 151, and 153 from being subjected to side etching on the side wall of the slit groove 51 by etching of silicon using the hot TMY. The protective layers 152A and 152C prevent the conductive layers 151 and 153 from being etched by etching the silicon using the hot TMY.

Figure 19:
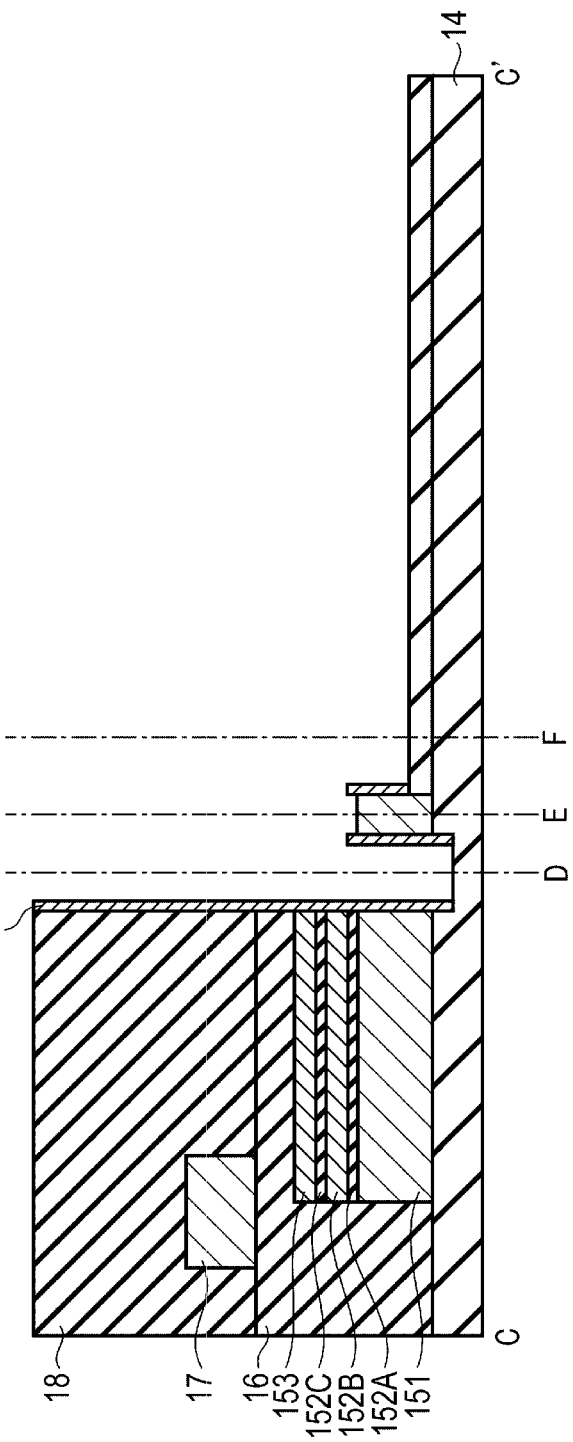
FIG. 19 is a diagram illustrating the method of manufacturing the first region of the slits according to the first embodiment.
Figure 20:
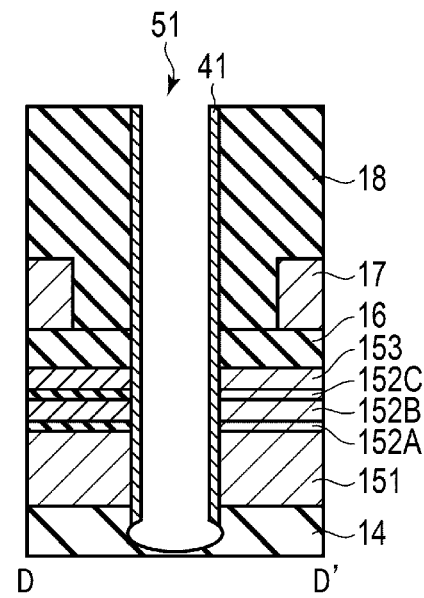
FIG. 20 is a diagram illustrating the method of manufacturing the first region of the slits according to the first embodiment.
Figure 21:
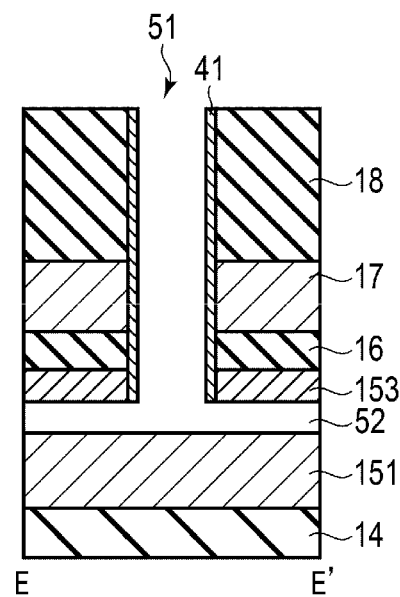
FIG. 21 is a diagram illustrating the method of manufacturing the first region of the slits according to the first embodiment.
Figure 22:
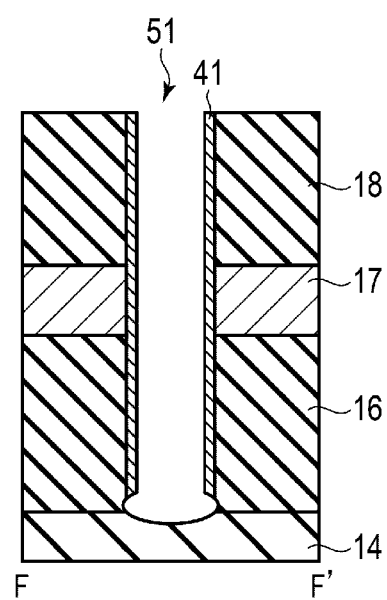
FIG. 22 is a diagram illustrating the method of manufacturing the first region of the slits according to the first embodiment.

Subsequently, for example, as illustrated in FIGS. 19 to 22, a part of the cell insulating layer 30 of the memory pillar MP and the protective layers (for example, silicon oxide layers) 152A and 152C are removed through the slit groove 51 in accordance with a chemical dry etching (CDE) method. The protective layers 152A and 152C corresponding to the opening 17A illustrated in FIG. 19, which correspond to the opening 17A, are not removed since the protective layers 152A and 152C are not the region in which the source layer is formed (step S5). Thus, the cross-sectional structure along the line C-C' is illustrated in FIG. 19. The cross-sectional structures along the lines D-D', E-E', and F-F' in FIG. 19 are illustrated in FIGS. 20, 21, and 22.

As illustrated in FIGS. 20 and 22, since the spacer layer (for example, a silicon nitride layer) 41 is on the side wall of the slit groove 51 and the insulating layer (for example, a silicon oxide layer) 14 is on the bottom surface of the slit groove 51 on the cross section along the lines D-D' and F-F', the insulating layer 14 on the bottom surface of the slit groove 51 is etched. However, since the insulating layer 14 is sufficiently thicker than the thicknesses of the cell insulating layer 30 and the protective layers 152A and 152C, the etching process does not affect on a wiring or the like of the peripheral circuit. As illustrated in FIG. 21, since a hollow 52 after the sacrificial layer 152B is removed is on the bottom surface of the slit groove 51 on the cross section along the line E-E' and the protective layers (silicon oxide layers) 152A and 152C are on the upper and lower sides of the hollow 52, the protective layers 152A and 152C are etched.

In a subsequent process, for example, a conductive layer containing multicrystal silicon to which impurities are added is formed in the hollow 52. Thus, a source layer is formed in the hollow 52. Thereafter, an insulating layer is buried in the slit groove 51. Thus, the slits ST and STC1 are formed. Further, thereafter, insulating layers, contacts, vias, bit lines, and other necessary wirings are formed to manufacture the semiconductor memory device.

1.2 Modification Examples

Next, a semiconductor memory device according to a modification example of the first embodiment will be described. In the modification example, a pattern shape of the conductive layer 17 is different from that of the first embodiment. On the extension line of the slit ST, the conductive layer 17 is not provided in a region more distant than the first region from the end of the conductive layer 17.

Figure 23A:
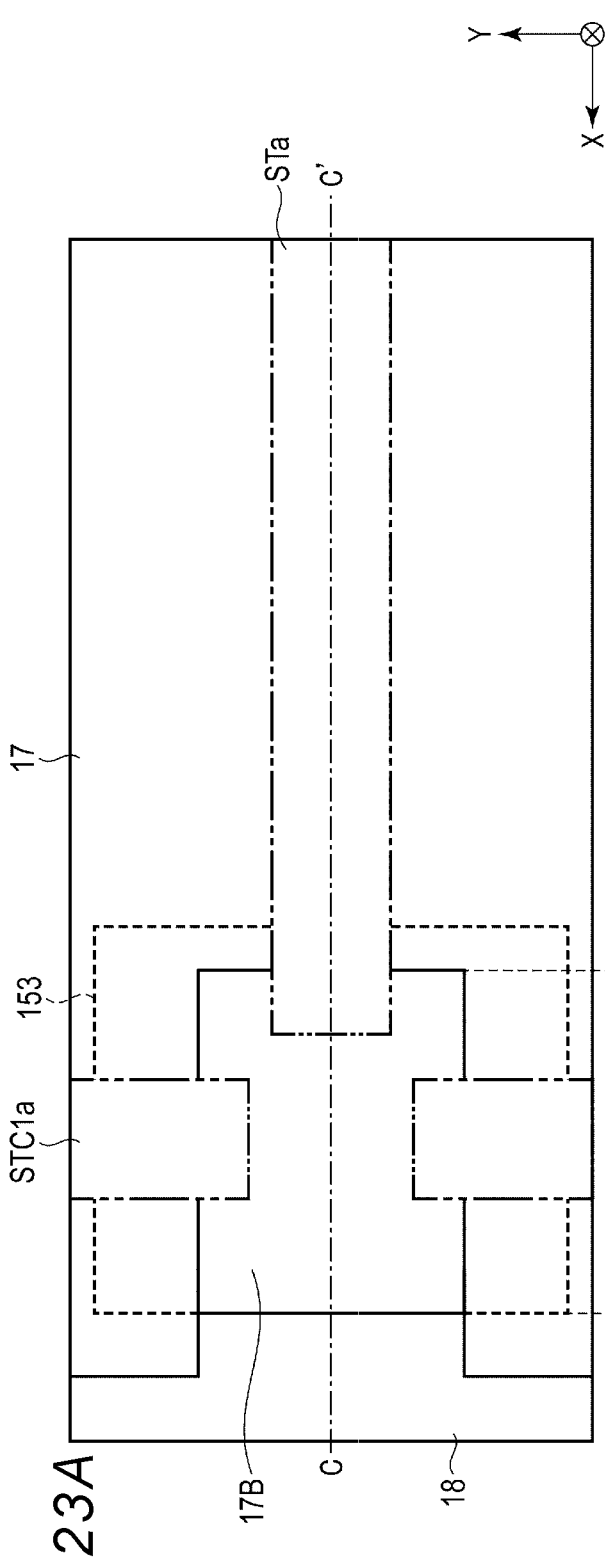
FIGS. 23A and 23B are diagrams illustrating the method of manufacturing the first region of the slits according to a modification example of the first embodiment.
Figure 23B:
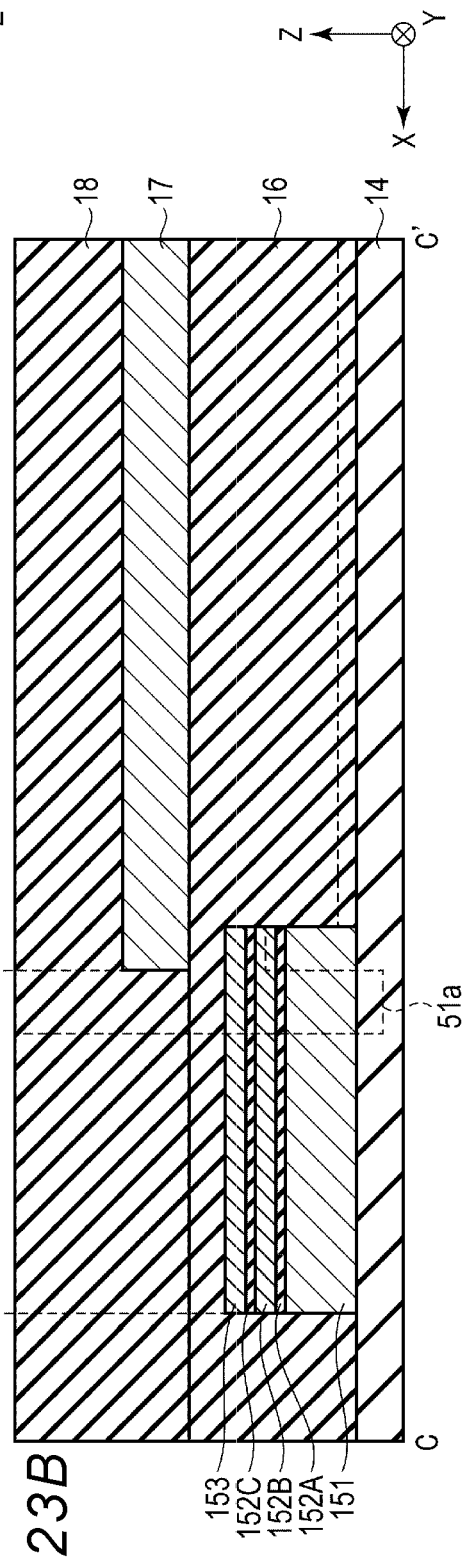

FIG. 23A is a plan view illustrating an expanded region equivalent to the first region 201 in the semiconductor memory device according to the modification example and FIG. 23B is a sectional view taken along the line C-C' of FIG. 23A. FIGS. 23A and 23B correspond to FIGS. 6A and 6B of the first embodiment. STa and STC1a illustrated in FIG. 23A indicate mask patterns of the slits ST and STC1 formed in subsequent processes and indicate the patterns and positions of the slits ST and STC1. A dotted line 51a illustrated in FIG. 23B indicates a shape of a groove assumed when a groove for the slits ST and STC1 is formed.

In the modification example, as illustrated in FIG. 23, the conductive layer 17 includes a depressed opening 17B in which there is no conductive layer 17. Then, the opening 17B is provided at a position corresponding to the first region in the Z direction. That is, the modification example has a structure in which the conductive layer 17 is not provided in the first region including the intersection region between the extension line of the slit ST and the extension line of the slit STC1 and the conductive layer 17 is not provided in a region more distant than the first region from the end of the conductive layer 17 on the extension line of the slit ST. The other remaining configuration and manufacturing method are the same as those of the above-described first embodiment.

1.3 Advantages of First Embodiment and Modification Example

In the first embodiment and the modification example, as described above, a stacked body including at least one of a conductive layer and an insulation layer, and the conductive layer 17 including the opening are provided in the Z direction of the first region including the intersection region in which the extension line of the slit ST and the extension line of the slit STC1 intersect each other, that is, the direction vertical to the semiconductor substrate surface in the first region. The opening and the stacked body are disposed at positions corresponding to the first region in the Z direction of the first region. The opening is a region in which the conductive layer 17 is removed. The stacked body is a part of the layer provided to form the source layer. Specifically, the stacked body includes the conductive layer 151, the protective layer 152A, the sacrificial layer 152B, the protective layer 152C, and the conductive layer 153.

In the above-described structure, the conductive layer 17 is removed using the opening, and the stacked body disposed in the first region including the intersection region between the extension line of the slit ST and the extension line of the slit STC1 works as a stopper delaying progress of etching when the groove for the slits ST, STC1, and STC2 is subsequently formed. Thus, it is possible to prevent the first region from being etched deeper than a target depth. Thus, it is possible to reduce a fault such as short-circuiting or the like of a wiring in the peripheral circuit and occurring in the deep etching of the first region. As a result, it is possible to reduce a defect rate in the semiconductor memory device. Further, it is also possible to improve reliability of the semiconductor memory device.

2. Second Embodiment

Next, a semiconductor memory device according to a second embodiment will be described. In the second embodiment, a pattern shape of the conductive layer 17 and the position of a stacked body in a region including an intersection region are different from those of the first embodiment. Herein, differences from the first embodiment will be mainly described.

2.1 Configuration of Semiconductor Memory Device

Figure 24:
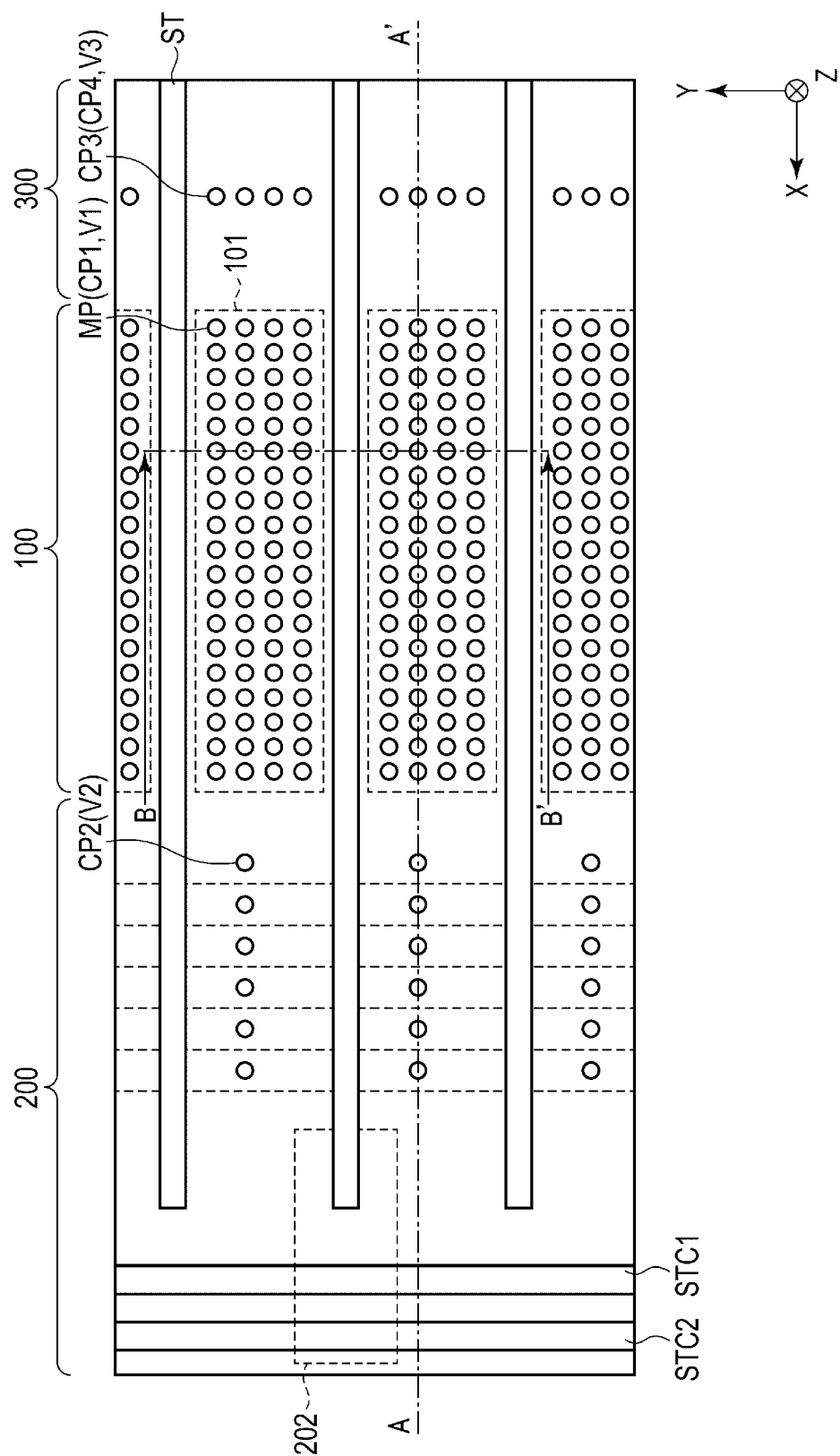
FIG. 24 is a plan view illustrating a configuration of a semiconductor memory device according to a second embodiment.

FIG. 24 is a plan view illustrating a configuration of the semiconductor memory device according to the second embodiment.

As described above, the slit ST extending in the X direction is provided between the memory blocks 101. The slit ST isolates the memory blocks 101. In other words, the slit ST isolates the conductive layers 17 and 19 to 24 and the memory cell array including the memory pillars MP.

On the chip end side of the drawing region 200, the end of the slit ST extending in the X direction is provided. The slit STC1 is provided to be spaced from the end of the slit ST so that the slit STC1 does not intersect the slit ST. The slit STC1 extends in the Y direction orthogonal to the X direction in which the slit ST extends. Further, the slit STC2 is provided to be spaced from the slit STC1. The slit STC2 extends in parallel to the slit STC1, that is, in the Y direction orthogonal to the X direction. The slits STC1 and STC2 have a function of alleviating stress of inter-layer insulating layers (for example, silicon oxide layers) provided in the drawing region 200, the memory cell array region 100, and the contact region 300.

2.1.1 Configurations of Slits ST, STC1, and STC2

Figures 25A, 25B:
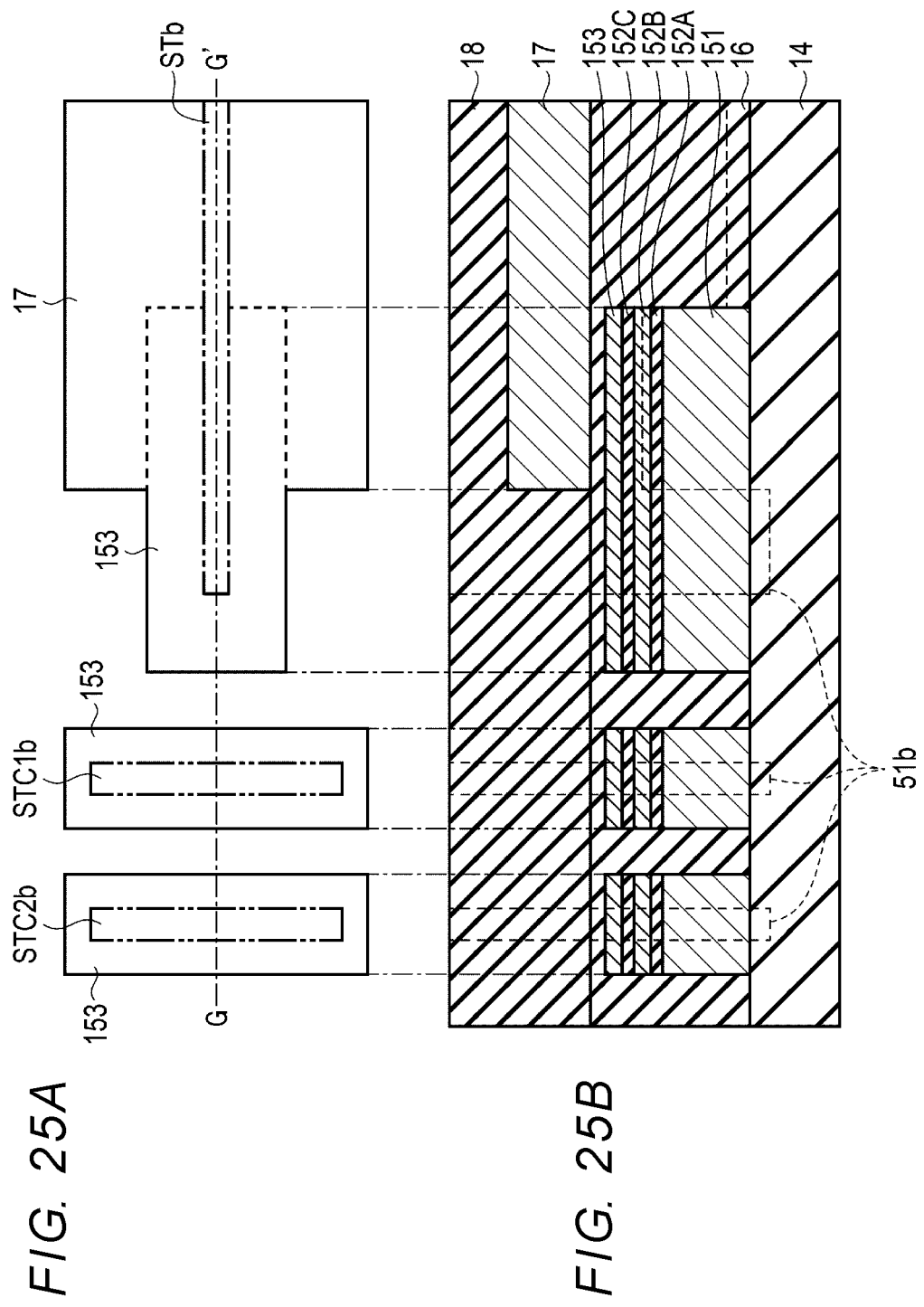
FIGS. 25A and 25B are diagrams illustrating a configuration of the first region of the slit before and after formation of the slit according to the second embodiment.

Next, a configuration of the slits ST, STC1, and STC2 in the semiconductor memory device according to the second embodiment will be described with reference to FIG. 25. FIG. 25A is a plan view illustrating an expanded second region 202 including an intersection region in which the extension line of the slit ST in FIG. 24 intersects the slits STC1 and STC2. FIG. 25B is a sectional view taken along the line G-G' of FIG. 25A. STb, STC1b, and STC2b illustrated in FIG. 25A indicate mask patterns of the slits ST, STC1, and STC2 formed in subsequent processes and indicate the patterns and positions of the slits ST, STC1, and STC2. A dotted line 51b illustrated in FIG. 25B indicates a shape of a groove assumed when a groove for the slits ST, STC1, and STC2 is formed.

As illustrated in FIG. 25, an end of the slit ST extending in the X direction is provided on the chip end side of the drawing region 200. The slit STC1 extending in the Y direction is provided to be spaced from the end of the slit ST. Further, the slit STC2 extending in the Y direction is provided to be spaced from the slit STC1.

The conductive layer 17 is not provided and is provided on the inner side of the end of the slit ST in the Z direction of the end of the slit ST. That is, the position of the end of the conductive layer 17 extending in the X direction is located to be closer to the memory cell array region 100 than the position of the end of the slit ST. Further, an island-shaped stacked body, that is, the conductive layer 151, the protective layer 152A, the sacrificial layer 152B, the protective layer 152C, and the conductive layer 153, is provided in the Z direction of the end of the slit ST.

The conductive layer 17 is not provided and the stacked body is provided in the Z direction of the slit STC1. Similarly, the conductive layer 17 is not provided and the stacked body is provided in the Z direction of the slit STC2.

A manufacturing method according to the second embodiment is performed in accordance with the flow illustrated in FIG. 5 after the structure illustrated in FIG. 25. The manufacturing method is the same as that described in the first embodiment.

2.2 Advantages of Second Embodiment

As described above, in the second embodiment, the stacked body including at least one of a conductive layer and an insulating layer without the conductive layer 17 is provided in the Z direction of the end of the slit ST, that is, the direction vertical to the semiconductor substrate surface at the end of the slit ST. The position of the end of the conductive layer 17 extending in the X direction is closer to the memory pillar than the position of the end of the slit ST. The stacked body is disposed at the position corresponding to the end of the slit ST in the Z direction of the end of the slit ST. The stacked body is a part of the layer provided to form the source layer.

The slits STC1 and STC2 extending in the Y direction are provided to be spaced from the end of the slit ST. The stacked body including at least one of the conductive layer and the insulating layer is provided in the Z direction of the slits STC1 and STC2. The stacked body is disposed at the position corresponding to the slits STC1 and STC2 in the Z direction of the slits STC1 and STC2.

In the above-described structure, the conductive layer 17 is removed on the chip end side from the region near the end of the slit ST, and the stacked body disposed in the second region including the intersection region between the extension line of the slit ST and the extension line of the slit STC1 works as a stopper delaying progress of etching when the groove for the slits ST, STC1, and STC2 is subsequently formed. Thus, it is possible to prevent the second region from being etched deeper than a target depth. Thus, it is possible to reduce a fault such as short-circuiting or the like of a wiring in the peripheral circuit and occurring in the deep etching of the second region. As a result, it is possible to reduce a defect rate in the semiconductor memory device. Further, it is also possible to improve reliability of the semiconductor memory device. The other advantages are the same as those of the above-described first embodiment.

3. Other Modification Examples

In the foregoing embodiments, "connection" includes not only direct connection between members and but also connection made through other members.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first conductive layer;
    a plurality of second conductive layers that extend in a first direction and are stacked above the first conductive layer in a second direction;
    a third conductive layer between the first conductive layer and the plurality of second conductive layers;
    a memory pillar that extends inside the plurality of second conductive layers in the second direction;
    a first insulating layer that extends in the first direction, and isolates the plurality of second conductive layers in a third direction orthogonal to the first direction and the second direction; and
    a plurality of second insulating layers spaced from an end of the first insulating layer and aligned along the third direction, each of the second insulating layers extending in the third direction,
    wherein the plurality of second insulating layers are spaced from an extension line of the first insulating layer that extends in the first direction,
    wherein the first conductive layer includes a region that overlaps in the second direction an intersection region in which the extension line of the first insulating layer intersects an extension line in which the plurality of second insulating layers are aligned, and
    wherein the third conductive layer does not overlap the intersection region in the second direction.

2. The semiconductor memory device according to claim 1,
    wherein the third conductive layer includes an opening, and
    wherein the opening overlaps the intersection region.

3. The semiconductor memory device according to claim 2,
wherein the first conductive layer includes a region overlapping the opening.

4. The semiconductor memory device according to claim 1, further comprising:
a plurality of third insulating layers and a plurality of fourth conductive layers that are alternately stacked above the region of the first conductive layer.

5. The semiconductor memory device according to claim 1,
wherein the third conductive layer is closer to the first insulating layer than to the intersection region on the extension line of the first insulating layer.

6. The semiconductor memory device according to claim 1,
wherein the memory pillar comprises a gate insulating layer, a semiconductor layer, and a charge storage layer, and
wherein the plurality of second conductive layers, the gate insulating layer, the semiconductor layer, and the charge storage layer form a plurality of memory cells.

7. The semiconductor memory device according to claim 1, wherein the first insulating layer and the plurality of second insulating layers extend below the first conductive layer.

8. The semiconductor memory device according to claim 1, wherein the first insulating layer contains silicon oxide, and each of the plurality of second insulating layers contains silicon oxide.

9. The semiconductor memory device according to claim 1,
wherein the first conductive layer has an island shape.

10. The semiconductor memory device according to claim 1,
wherein the third conductive layer is thicker than one of the plurality of the second conductive layers.

11. A semiconductor memory device comprising:
a first conductive layer;
a source layer provided at a same layer level as the first conductive layer;
a plurality of second conductive layers that extend in a first direction and are stacked above the first conductive layer in a second direction;
a third conductive layer between the source layer and the plurality of second conductive layers in the second direction and extending in the first direction;
a memory pillar that extends inside the plurality of second conductive layers in the second direction, is provided directly above the source layer, and is in direct contact with the source layer; and
a first insulating layer that extends in the first and second directions, and isolates the plurality of second conductive layers in a third direction orthogonal to the first direction and the second direction,
wherein in the first direction, a first distance from an end of the third conductive layer to the memory pillar is less than a second distance from an end of the first insulating layer to the memory pillar, and the second distance is less than a third distance from an end of the first conductive layer that is farther from the memory pillar, to the memory pillar.

12. The semiconductor memory device according to claim 11,
wherein the first conductive layer has an island shape.

13. The semiconductor memory device according to claim 11, further comprising:
a second insulating layer that is spaced from the end of the first insulating layer and extends in the third direction.

14. The semiconductor memory device according to claim 13, further comprising:
a third insulating layer spaced from the second insulating layer in the first direction and extending in the third direction.

15. The semiconductor memory device according to claim 11,
wherein the third conductive layer is thicker than one of the plurality of second conductive layers.

16. The semiconductor memory device according to claim 11, wherein a width of the first conductive layer in the third direction is greater than a width of the first insulating layer in the third direction.

* * * * *